(12) United States Patent
Yim et al.

(10) Patent No.: US 6,576,513 B2
(45) Date of Patent: Jun. 10, 2003

(54) NAND-TYPE FLASH MEMORY DEVICE AND METHOD OF FORMING THE SAME

(75) Inventors: Yong-Sik Yim, Kyunggi-do (KR); Jung-Dal Choi, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/272,972

(22) Filed: Oct. 16, 2002

(65) Prior Publication Data

US 2003/0032245 A1 Feb. 13, 2003

Related U.S. Application Data

(62) Division of application No. 09/965,532, filed on Sep. 26, 2001.

(30) Foreign Application Priority Data

Jan. 20, 2001 (KR) .......................................... 2001-3426

(51) Int. Cl.[7] .......................................... H01L 21/8247
(52) U.S. Cl. ........................ 438/257; 438/279; 438/302
(58) Field of Search ................................ 438/257, 267, 438/302, 279

(56) References Cited

U.S. PATENT DOCUMENTS

| 5,147,811 A | 9/1992 | Sakagami |
|---|---|---|
| 5,190,887 A | 3/1993 | Tang et al. |
| 5,783,457 A | 7/1998 | Hsu |
| 5,851,886 A | 12/1998 | Peng |
| 5,891,774 A | 4/1999 | Ueda et al. |
| 5,920,776 A | 7/1999 | Fratin et al. |
| 6,048,770 A | 4/2000 | Sakakibara |
| 6,214,666 B1 | 4/2001 | Mehta |

OTHER PUBLICATIONS

Choi, et al., "A 0.15 $\mu$m NAND flash memory with 0.11 $\mu m^2$ cell size for 1Gbit flash memory", *IEDM 2000*; (4 pages).
Suh, et al., "A 3.3V 32Mb flash memory with incremental step pulse programming scheme", *IEEE J. Solid–State Circuit*, vol. 30, No. 11, pp. 1149–1156, Nov. 1995.
Hori, T., "A 0.1 $\mu$m CMOS Technology with Tilt–implanted Punchthrough Stopper (TIPS)", *IEDM 1994*, pp. 75–78.

*Primary Examiner*—Richard Booth
(74) *Attorney, Agent, or Firm*—Marger Johnson & McCollom P.C.

(57) ABSTRACT

A NAND-type flash memory device for preventing punch-through and a method for forming the same are provided. The NAND-type flash memory device includes a string selection transistor, a plurality of cell memory transistors, and a ground selection transistor being sequentially connected in series. The device further includes a bitline contact connected to a drain region of the string selection transistor, and a common source line connected to a source region of the ground selection transistor. Impurities are heavily doped to a drain-to-channel interface in the string selection transistor and a channel-to-source interface in the ground selection transistor, forming pockets for preventing punch-through. The pockets are preferably formed using a tilted ion implantation using the vertical gate structures as masks.

6 Claims, 3 Drawing Sheets

NAND-TYPE FLASH MEMORY DEVICE AND METHOD OF FORMING THE SAME

BACKGROUND OF THE INVENTION

This application is a divisional of U.S. patent application Ser. No. 09/965,532, filed on Sep. 26, 2001, now pending which is herein incorporated by reference in it's entirety.

1. Field of the Invention

The present invention generally relates to a NAND-type flash memory device and a method of forming the same. More specifically, the invention is directed to a NAND-type flash memory device having only minimal leakage current resulting from a short channel effect within a string selection transistor and a ground selection transistor, and a method of forming the same.

2. Description of the Prior Art

As semiconductor devices trend become more highly integrated due to improved semiconductor manufacturing techniques, the channel lengths within transistor devices are necessarily reduced. One unfortunate byproduct of reduced structure size is punchthrough, where the depletion regions of a source and a drain merge together and thereby prevent the channel current from being easily controlled. One known prior art method of preventing punchthrough is to increase the impurity concentration within the substrate. This impurity doping enables the depletion regions to be narrow such that they do not merge together.

Unfortunately, raising the impurity concentration of a channel or a source/drain region increases the intensity of the electric field formed at the junction area between the regions. Thus, raising the impurity concentration using methods known in the prior art causes additional problems of hot carriers or a corresponding increase in the leakage current from high conductive regions to the substrate.

Since a NAND-type flash memory device is a highly integrated semiconductor device, it also suffers from the punchthrough as described above. FIG. 1 is a top plan view showing a string portion of the device comprising a formation unit in a cell area of a conventional NAND-type flash memory. A plurality of cell memory transistors are serially connected to each other, as by wordline WL which crosses over each active region. In each string, there are a string selection transistor and a bitline contact BC at one end of the cell memory transistors, and there are a ground selection transistor and a common source line CSL at the other end. The string selection transistor is formed at a position where a string select line SSL crosses over an active region, while the ground selection transistor is formed at a position where a ground select line GSL crosses over an active region.

The string select line SSL and the ground select line GSL are continuously coupled along a line, on which a floating gate layer is not floated. The floating gate layer (shown in FIG. 4 at 13) is patterned at a wordline WL where a memory cell array is formed, isolating and floating SSL and GSL in each transistor.

FIG. 2 is a cross-sectional view taken along line I—I of FIG. 1. As the integration level of flash memory devices increases, both the wordline-to-wordline space "a" and the channel length decrease while the wordline height "b" increases relative to the length of the device structures—in other words, the aspect ratio increases. The areas where bitline contact BC and common source line CSL are formed, denoted by the dimensions "c" and "d", are wider than the space "a". In this case, the region "c" spans the distance from a string select line SSL1 of one string to a string select line SSL0 of an adjacent opposite string, and the region "d" spans the distance from a ground select line $GSL_1$ of one string to a string select line $GSL_2$ of an adjacent opposite string.

With highly integrated NAND-type flash memory devices, punchthrough tends to occur in the string selection transistor and the ground selection transistor. Furthermore, increased integration using known methods creates a greater likelihood of leakage current caused by short channel effects. One method for addressing these limitations in NAND-type flash memory devices is to use ion implantation to form a heavily doped impurity layer P over a surface of a semiconductor substrate when a well P⁻ for preventing punchthrough is formed on the substrate, as shown in FIG. 3.

Further prior art process steps are illustrated in FIG. 4 where the device includes a gate insulating layer 11, a floating gate layer 13, a dielectric layer 15, and a control gate layer 17 sequentially formed on a substrate 10. These material layers are patterned respectively or together, forming a gate line that conceptually includes a wordline, a string select line, and a ground select line. Impurities are then implanted into those portions of the substrate exposed by patterning a gate line, the impurities thereby forming a source/drain region 19. In this case, the type of impurities used is contrary to that of the well. However, such a structure shown in FIG. 4 exhibits increased junction leakage current in the cell memory transistor, and thereby creates errors in programming the cell memory (Choi, et al., "A 0.15 $\mu$m NAND flash memory with 0.11 $\mu m^2$ cell size for 1 Gbit flash memory," IEDM 2000, accepted: Suh, et al., "A 3.3V 32 Mb flash memory with incremental step pulse programming scheme," IEEE. J. Solid-state Circuit, Vol. 30, No. 11, pp. 1149–1156, November 1995.).

Accordingly, it is desired to develop a method for maintaining the ion concentration level in a cell memory transistor at a particular level without performing an ion implantation for preventing a punchthrough, and to suppress a leakage current resulting from a short channel effects in a string selection transistor or a ground selection transistor.

SUMMARY OF THE INVENTION

It is an object of the present invention to provide a NAND-type flash memory device that is able to prevent memory dysfunction caused by punchthrough at a drain region of a string selection transistor and a merge area in which a source region of a ground selection transistor merges with their channel in each string of the NAND-type flash memory device, and a method of forming the same.

It is another object of the present invention to provide a NAND-type flash memory device that is able to prevent an increase in a junction leakage current and resulting programming disturbance phenomenon when a heavily doped pocket for preventing punchthrough is installed in a cell memory transistor of the NAND-type flash memory device, and a method of forming the same.

One method suggested in the literature for addressing these objects includes forming heavily doped pocket areas in the device during processing. (Hori, "A 0.1 $\mu$m CMOS technology with Tilt-Implanted Punchthrough Stopper," IEDM 1994, pp. 75–78: "Field effect-transistor with asymmetrical structure," U.S. Patent 1986, Codella, et al.). Nonetheless, the method for forming such pockets is non-trivial and has proven very difficult for highly integrated devices such as NAND-type flash memories. The present invention addresses this deficiency.

A NAND-type flash memory device conventionally includes a string selection transistor, a plurality of cell memory transistors, a ground selection transistor that are serially connected; a bitline contact that is connected to a drain region of the string selection transistor; and a common source line that is connected to a source area of the ground selection transistor. According to one feature of the present invention, heavily doped pockets for preventing punchthrough are formed in the NAND-type flash memory. Impurities are doped definitely to one interface between a channel and a drain region of the string selection transistor, and to another interface between a channel and a source region of the ground selection transistor.

The pockets, which are highly doped areas, can penetrate into an adjacent channel region with a constant distance. Preferably, the pockets control an ion implantation energy, enabling a maximum concentration point to reach the same level as the depth of a source/drain-substrate junction area or a source/drain-well junction area. Usually, the heavily doped impurities are identical in type to impurities that are doped to a channel.

According to another feature of the invention, a gate electrode profile is formed on a plurality of active regions that are parallel with each other. In the profile, a gate insulating layer, a floating gate layer, a dielectric layer, and a control gate layer are sequentially stacked. The gate electrode profile is patterned to form gate lines that are vertical to the active region. In the gate lines, a string select line, a plurality of wordlines, and a ground select line are sequentially formed to compose a construction unit (generally called "string") of a NAND-type flash memory, thereby forming a string selection transistor, a cell memory transistor, and a ground selection transistor at a region across the active region. Using the gate lines as ion implantation masks, a tilted ion implantation is then carried out.

The angle of implantation is carefully controlled to carry out the ion implantation only to an active region adjacent to an opposite sidewall of the wordline out of both sidewalls of the string select line, and to an active region adjacent to an opposite sidewall of the wordline out of both sidewalls of the ground select line. In this case, an interlayer insulating layer, a bitline contact, a common source line, and a structure thereon are not formed yet. Since a conventional cell memory transistor is an N-channel transistor, the tilted ion implantation is carried out with P-type impurity ions.

BRIEF DESCRIPTION OF THE DRAWINGS

The present invention will be described with respect to the preferred embodiment thereof. Other objects, features, and advantages of the invention will become apparent with reference to the specification and drawings, in which.

DESCRIPTION OF THE PREFERRED EMBODIMENT

Figure 1:
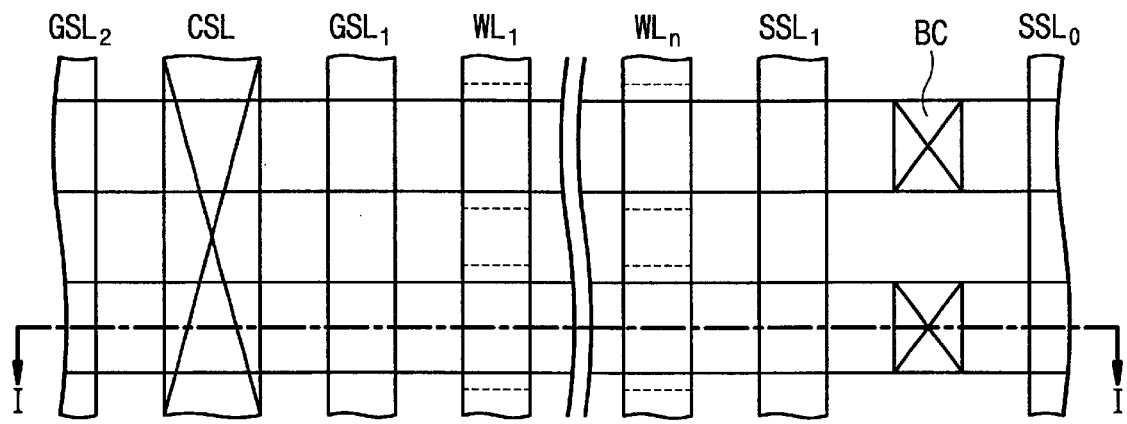
FIG. 1 is a top plan view showing a string part to be a formation unit at a cell region of a conventional NAND-type flash memory.
Figure 2:
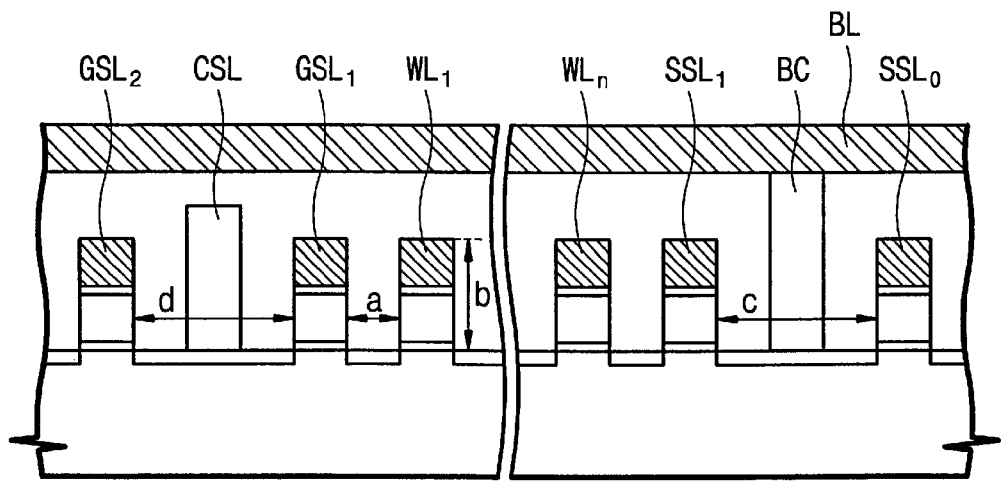
FIG. 2 is a cross-sectional view taken along a line I—I of FIG. 1.
Figure 3:
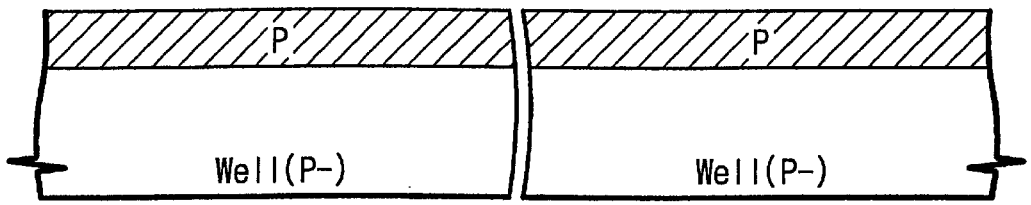
FIGS. 3 and 4 are cross-sectional views showing a punchthrough ion implantation process and a source/drain ion implantation process for forming a heavily doped impurity layer at a surface of a semiconductor substrate in a NAND-type flash memory device according to the prior art.
Figure 4:
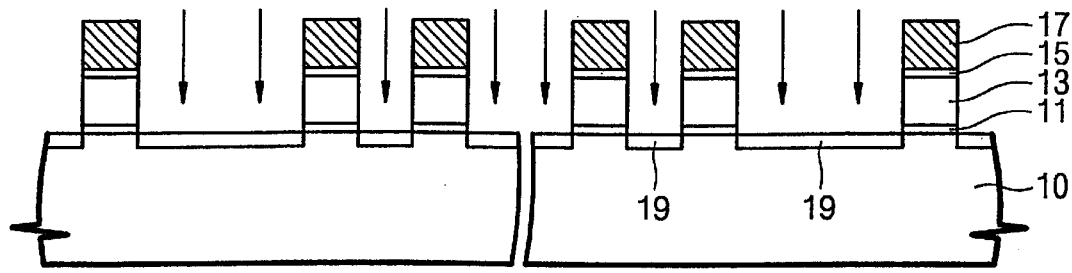
Figure 5:
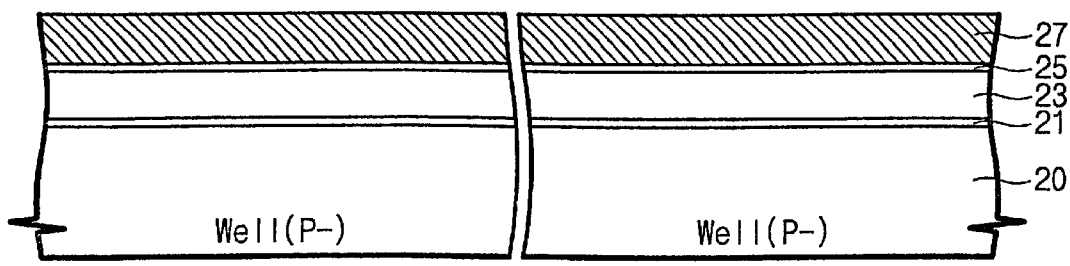
FIGS. 5 through 8 are cross-sectional views showing the formation process including an ion implantation for preventing punchthrough according to the present invention.

As illustrated in FIG. 5, a profile is formed at an active region of a substrate 20. In the profile, a gate insulating layer 21, a floating gate layer 23, a dielectric layer, and a control gate layer 27 are sequentially stacked. The P-type impurities are then lightly doped to the semiconductor substrate to form a well, as by using a shallow trench isolation (STI) technique, to form a device isolation layer to define the active region. Even though floating gate layers and a control gate layers are essential at an area where a wordline is to be formed, one of them can be omitted at a string select line area or a ground select line area.

Figure 6:
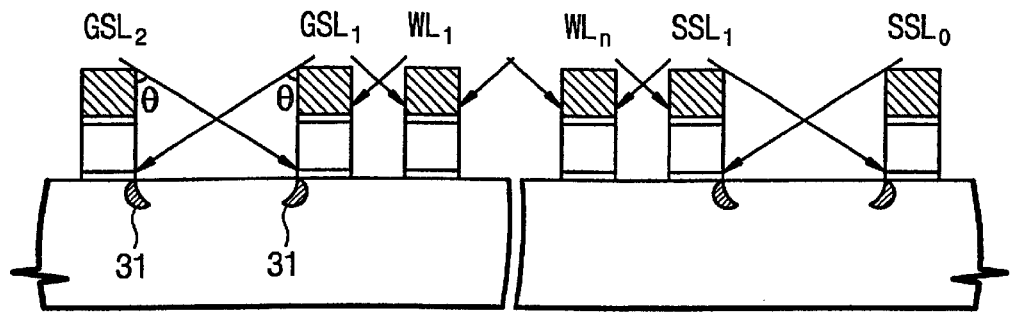

Referring now to FIG. 6, a stacked profile shown in FIG. 5 is patterned to form a plurality of gate lines WL, SSL, and GSL across an active region. Using these gate lines WL, SSL, and GSL as ion implantation masks, a tilted ion implantation for preventing punchthrough is carried out to form a pocket 31 that is doped by high concentration impurities of P-type, as by using $BF_2$. In this case, the preferred dosage of the implanted impurities is $1 \times 10^{15}$ ion/$cm^2$. The tilt angle of the implantation step, expressed as $\theta$, is the angle between the implant tilt and a vertical line to the substrate. The angle of implantation is preferably set to where $\tan \theta$ will be between a/b and c/b (i.e., a/b<$\tan \theta$<c/b) and is most preferably close to b/c. Here, "b, a, and c" represent a height of a gate line, a distance length between gate lines in an identical string, and a distance between adjacent ground select lines or adjacent string select lines, respectively. The desired ion implantation energy used should be sufficient to gain a maximal impurity concentration at the same depth as the $N^+$-type impurities implanted into the following source/drain regions to maximally limit punchthrough.

Figure 7:
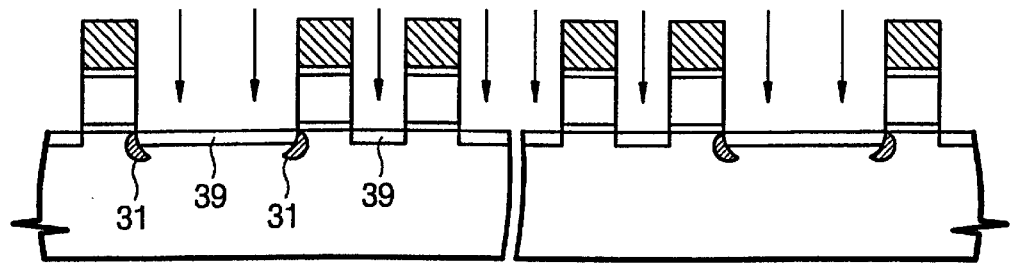

Referring now to FIG. 7, N-type impurity ions are implanted to form source/drain regions 39 using gate lines as ion implantation masks. Ion implantations for forming source/drain regions and preventing punchthrough may be changeable in order. Conventionally, the ion implantation for forming source/drain regions is divided into two steps so as to form a lightly doped drain (LDD). That is, a low concentration ion implantation is carried out in a first step and then a high concentration ion implantation is carried out in a second step with a spacer formed on a gate line sidewall. After carrying out the ion implantations, a thin etch-stop layer made of silicon nitride is stacked on an entire surface of a substrate. The common source line or a bitline contact is then formed in the following process.

Figure 8:
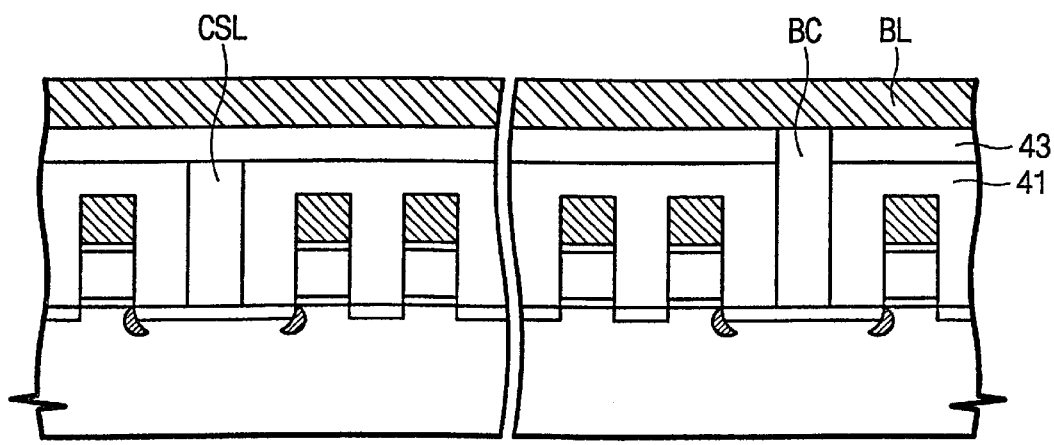

Referring to FIG. 8, an interlayer insulating layer 41 is stacked on an entire surface of the structure shown in FIG. 7. A common source line area is then etched to form a groove that exposes a common source region of the substrate. A conductive layer for filling the groove is stacked and planarly etched to form a common source line CSL. An insulating layer 43 is additionally formed, and a bitline contact hole is formed. A conductive layer (used for forming a bitline) is then stacked and patterned to form a bitline contact BC and a bitline BL.

In the resulting structure of the string in the flash memory device, a bitline contact is formed at one end of a string and a common source line is formed at the other end thereof. A string selection transistor, a plurality (8 or 16 or 32) of cell memory transistors, and a ground selection transistor are serially connected between the bitline contact and the common source line. That is, a source region of one transistor is directly connected to a drain region of the other transistor. A channel is formed under a gate of each transistor. Each of channel-source/drain junction areas has a lightly doped drain (LDD) structure, which is preferred but not essential. A P-type heavily doped pocket for preventing punchthrough is formed at a channel-drain junction area in the string selection transistor and a channel-source junction area in the ground selection transistor.

In summary and in accordance with the present invention, gate lines in a string of a NAND-type flash memory device are densely arranged to have a high aspect ratio. In the ion implantation, a bitline contact and a common source line are not formed between strings. Thus, a wide space is created and a low aspect ratio is achieved. A tilted ion implantation is carried out to form an impurity pocket for preventing punchthrough without a separate mask. The pockets are able to suppress short channel effect at a channel-drain junction area in a string selection transistor and a channel-source junction area in a ground selection transistor.

Having described and illustrated the principles of the invention in a preferred embodiment thereof, it should be apparent that the invention can be modified in arrangement and detail without departing from such principles. We claim all modifications and variation coming within the spirit and scope of the following claims.

What is claimed is:

1. A method of forming a NAND-type flash memory device, comprising the steps of:

forming parallel device isolation layers to define a plurality of parallel active regions on a substrate;

forming a gate electrode profile in which a gate insulating layer, a floating gate layer, a dielectric layer, and a control gate layer are stacked sequentially on the active regions;

patterning the gate electrode profile to form a plurality of gate line sets having a string select line, a plurality of wordlines, and a ground select line, the gate line sets being vertical to the active regions to define a height above the active regions; and carrying out a tilted ion implantation, using the gate line sets as ion implantation masks, wherein the step of carrying out a tilted ion implantation occurs at a tilted angle, said tilted angle being sufficient to carry out the tilted ion implantation only to an active region adjacent to an opposite sidewall of the wordline out of both sidewalls of the string select line, and to an active region adjacent to an opposite sidewall of the wordline out of both sidewalls of the ground select line.

2. The method as claimed in claim 1, wherein if an ion implantation tilt angle of a perpendicular line to the substrate is θ, the tilt angle θ is selected to satisfy a range such that $a/b < \tan\theta < c/b$, wherein a, b, and c represent a vertical height of the gate line set, a distance between gate lines in an identical string, and a distance between adjacent ground select lines or adjacent string select lines, respectively.

3. The method of claim 2, wherein the tilt angle θ is selected so that $\tan\theta$ is approximately equal to $b/c$.

4. The method as claimed in claim 1, wherein the tilted ion implantation is carried out using high concentration impurities that are identical in type to impurities doped to the active regions.

5. The method as claimed in claim 1, wherein the tilted ion implantation is carried out using P-type impurity ions.

6. The method as claimed in claim 5, further including the step of selecting an ion implantation energy during the step of carrying out at tilted ion implantation so that a maximal impurity concentration of the impurity ions implanted is at the same depth at which impurities are implanted into source/drain regions of the NAND-type flash memory device.

* * * * *